US009666288B2

(12) United States Patent
Matsunami et al.

(10) Patent No.: US 9,666,288 B2
(45) Date of Patent: May 30, 2017

(54) SEMICONDUCTOR INTEGRATED CIRCUIT DEVICE HAVING ELECTRICALLY REWRITEABLE READ-DEDICATED MEMORY (71) Applicant: FUJI ELECTRIC CO., LTD., Kawasaki-shi, Kanagawa (JP)

(72) Inventors: Kazuhiro Matsunami, Matsumoto (JP); Mutsuo Nishikawa, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/174,976

(22) Filed: Jun. 6, 2016

(65) Prior Publication Data
US 2017/0018310 A1    Jan. 19, 2017

(30) Foreign Application Priority Data

Jul. 15, 2015  (JP) .................................. 2015-141241

(51) Int. Cl.
| G11C 16/04 | (2006.01) |
| G11C 16/10 | (2006.01) |
| H01L 27/11521 | (2017.01) |
| G11C 16/30 | (2006.01) |
| G11C 5/06 | (2006.01) |
| H01L 27/115 | (2017.01) |
| G06F 12/02 | (2006.01) |

(52) U.S. Cl.
CPC ................ *G11C 16/10* (2013.01); *G11C 5/06* (2013.01); *G11C 16/30* (2013.01); *H01L 27/11521* (2013.01); *G06F 12/0246* (2013.01); *H01L 27/115* (2013.01)

(58) Field of Classification Search
CPC ..... G11C 16/0483; G11C 16/10; G11C 16/30; G11C 5/06; G11C 29/82; H01L 27/115; H01L 27/11521; G06F 12/0246
USPC ............ 365/185.05, 63, 51, 185.11; 711/103
See application file for complete search history.

(56) References Cited

U.S. PATENT DOCUMENTS

| 7,463,517 | B2 * | 12/2008 | Shukuri ................. B82Y 10/00 |
| | | | 365/185.05 |
| 2002/0149984 | A1 | 10/2002 | Nishikawa et al. |
| 2015/0287439 | A1 | 10/2015 | Nishikawa et al. |

FOREIGN PATENT DOCUMENTS

| JP | 2002-310735 A | 10/2002 |
| JP | 2005-026307 A | 1/2005 |
| JP | 2009-231650 A | 10/2009 |
| JP | 2012-160611 A | 8/2012 |
| JP | 2012-209526 A | 10/2012 |
| JP | 2015-201645 A | 11/2015 |

* cited by examiner

*Primary Examiner* — David Lam
(74) *Attorney, Agent, or Firm* — Rabin & Berdo, P.C.

(57) ABSTRACT

On an IC chip, a first ground wiring line and a second ground wiring line that extends from a connection site with the first ground wiring line are disposed in a doubled manner. Among EPROMs storing identical data, the source of a first EPROM is connected to the second ground wiring line and the source of a second EPROM is connected to the first ground wiring line. The drains of the EPROMs are electrically connected to a write voltage line. An OR circuit outputs as 1-bit data of the memory circuit, the logical sum of the data stored by at least two of the EPROMs storing identical data. The EPROMs and the OR circuit are disposed near each other on the IC chip.

13 Claims, 6 Drawing Sheets

SEMICONDUCTOR INTEGRATED CIRCUIT DEVICE HAVING ELECTRICALLY REWRITEABLE READ-DEDICATED MEMORY

CROSS REFERENCE TO RELATED APPLICATIONS

This application is based upon and claims the benefit of priority of the prior Japanese Patent Application No. 2015-141241, filed on Jul. 15, 2015, the entire contents of which are incorporated herein by reference.

BACKGROUND OF THE INVENTION

1. Field of the Invention

Embodiments of the invention relate to a semiconductor integrated circuit device.

2. Description of the Related Art

In semiconductor integrated circuit (IC) devices such as a semiconductor physical quantity sensor device that is equipped with a physical quantity sensor (e.g., a pressure sensor or accelerometer) and used in various types of devices such as those for automobiles, medical purposes, manufacturing purposes, and the like, output characteristics of the physical quantity sensor are adjusted by trimming. The precision of the physical quantity sensor is increased by trimming, for example, the sensitivity, temperature characteristics, offset, etc.

A conventional laser trimming technique for performing such trimming is disadvantageous in that even when output characteristics vary at an assembly process after trimming, readjustment is not possible. Therefore, recently, an electrical trimming technique is employed that uses Erasable Programmable Read Only Memory (EPROM) and can adjust output characteristics after the assembly process has been completed.

As a semiconductor integrated circuit device that performs electrical trimming using EPROM, a device has been proposed that measures sensor output while gradually varying provisional data stored by a shift register to thereby set trimming data that obtains a desired sensor output. The device further stores the trimming data to the EPROM, and uses the stored trimming data to adjust the sensor output (for example, refer to Japanese Patent Application Laid-Open Publication No. 2002-310735).

Nonetheless, in electrical trimming by EPROM, a problem arises in that bit corruption occurs where data written to the EPROM changes (bits are inverted) consequent to leakage of charge accumulated in the EPROM or charge injection into the EPROM.

Thus, a redundancy design is commonly adopted where two or more EPROMs storing identical data are provided for each bit and the logical sum (OR) or majority function is taken, whereby the data is prevented from varying even when charge leakage or charge injection occurs at one of the EPROMs storing identical data.

Figure 5:
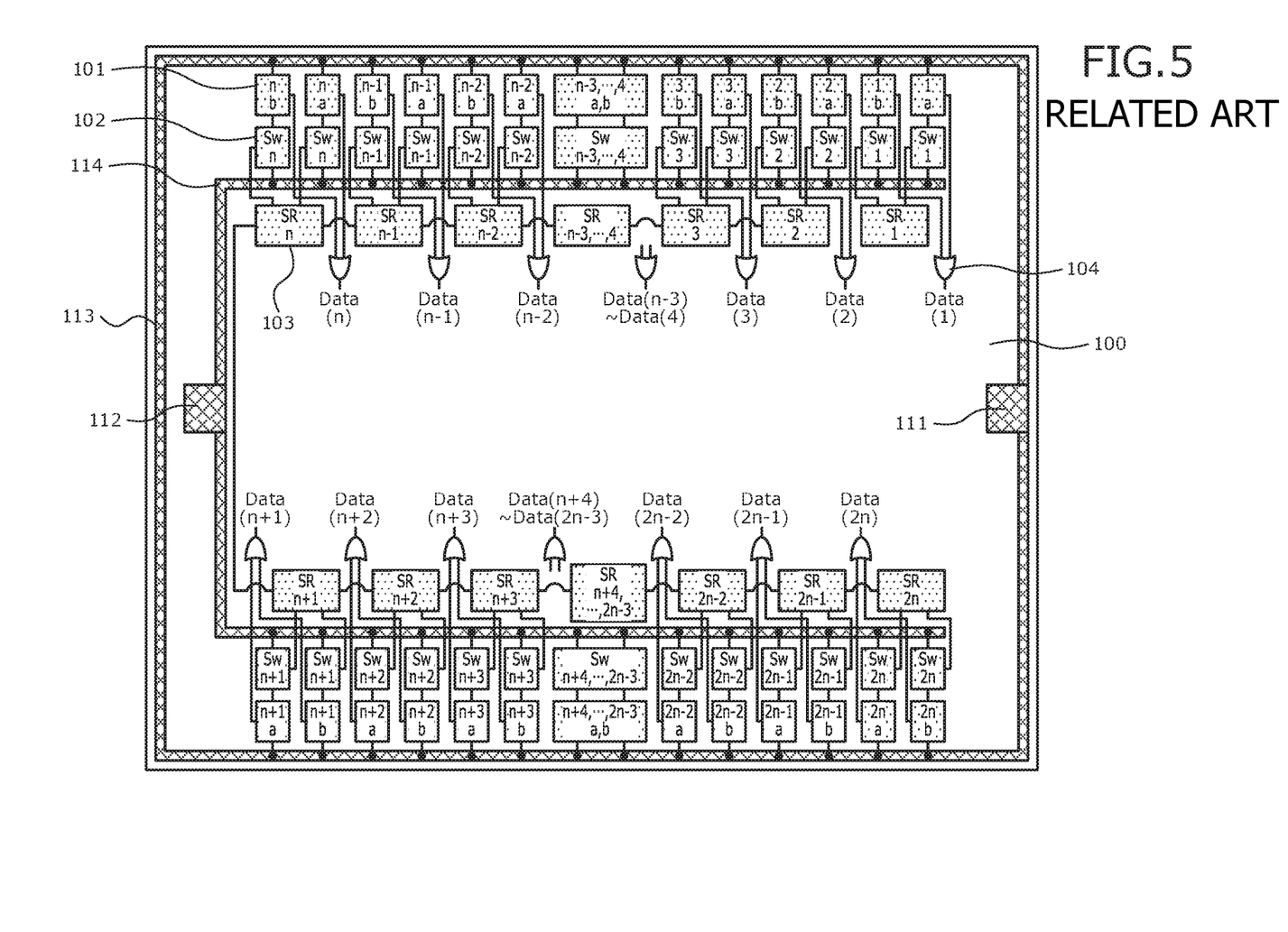
FIG. 5 is a plan view of an example of a planar layout of a conventional semiconductor integrated circuit device.

Configuration of a conventional semiconductor integrated circuit device will be described. FIG. 5 is a plan view of an example of a planar layout of a conventional semiconductor integrated circuit device. A memory circuit of the conventional semiconductor integrated circuit device depicted in FIG. 5 is produced on an IC chip (semiconductor chip) 100 and includes EPROMs 101, switches (Sw) 102, shift registers (SR) 103, and OR circuits 104. In a peripheral portion of the IC chip 100, a ground wiring line 113 is disposed along a periphery of the IC chip 100, in a substantially rectangular shape and is connected to a ground terminal (ground pad) 111. Farther inward on the IC chip 100 than the ground wiring line 113, a write_voltage wiring line 114 is disposed along a periphery corresponding to three sides of the IC chip 100, is disposed in a substantially rectangular shape having one opened portion (substantially a "U" shape or substantially a "⊐" shape), and is connected to write_voltage terminal (write_voltage pad) 112.

Between the ground wiring line 113 and the write_voltage wiring line 114, sets of at least two EPROMs 101 that store identical data (1 bit) and form a 1-bit storage region 5 (see, e.g., FIG. 1) of the memory circuit are connected in parallel corresponding to the storage capacity (bit count) of the memory circuit. Connection of a set of EPROMs 101 that store identical data (1 bit) and form a 1-bit storage region 5 of the memory circuit to a single OR circuit 104 achieves a redundancy design with respect to charge leakage of the EPROMs 101. In FIG. 5, an example is depicted where the storage capacity of the memory circuit is 2n (n: natural number) bits, and for each bit, two EPROMs 101 (a and b in the drawing; and 101a and 101b hereinafter) are provided. In the drawing, the bit numbers assigned to the EPROMs 101a, 101b are 1, 2, 3, 4, . . . , n−3, n−2, n−1, n, n+1, n+2, n+3, n+4, . . . , 2n−3, 2n−2, 2n−1, 2n. Each OR circuit 104 outputs the logical sum of the data in the EPROMs 101a, 101b connected thereto, whereby output Data (i) (i=1, 2, . . . , 2n−1, 2n) from the OR circuit 104 is maintained even when charge leakage occurs at one of the EPROMs among the EPROM 101a, 101b.

When redundancy related to data retention characteristics of the EPROMs 101 is enhanced by combining multiple EPROMs 101 in this manner, increases in the area of the IC chip 100 are typically suppressed by combining components that are disposed near each other (e.g., adjacently) on the IC chip. For example, the EPROMs 101 are disposed between the ground wiring line 113 and the write_voltage wiring line 114, along the ground wiring line 113. The same data is stored to adjacent EPROMs 101a, 101b. FIG. 5 depicts a state where the EPROMs 101 are disposed in a row so as to be along peripheries corresponding to a first pair of opposite sides of the IC chip 100. The switches 102 that supply drain voltage to a pair of EPROMs 101a, 101b, the shift registers 103 that control the ON and OFF state of these switches 102, and the OR circuit 104 connected to the pair of EPROMs 101a, 101b, are disposed close to the corresponding pair of EPROMs 101a, 101b.

The drain of an EPROM 101 is connected to the write_voltage wiring line 114 via a switch 102 and the source is connected to the ground wiring line 113. The EPROM 101 is a metal oxide semiconductor field effect transistor (MOSFET) in a flooding (floating) state where the gate is open (not depicted). On the gate in the flooding state (flooding gate), a control gate is provided via an oxide film. Therefore, when data is written to the EPROM 101 and the switch 102 is turned ON, the predetermined EPROM 101 and the write_voltage terminal 112 are caused to conduct, write_voltage is applied to the write_voltage terminal 112, and high voltage of a threshold voltage or greater is applied to the control gate of the EPROM 101. As a result, charge is injected into and accumulates in the flooding gate of the predetermined EPROM 101.

Figure 6:
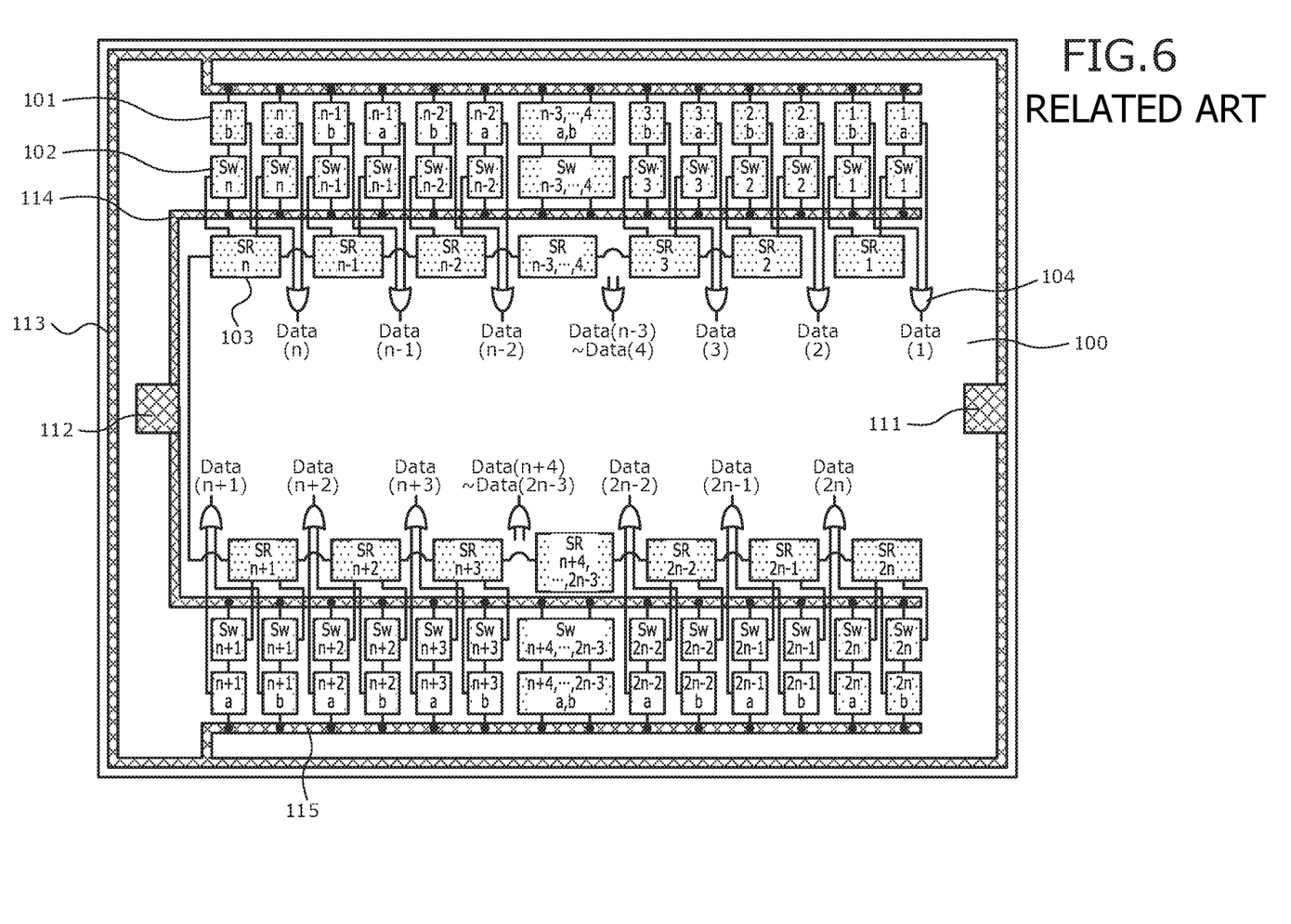
FIG. 6 is a plan view of another example of a planar layout of a conventional semiconductor integrated circuit device.

Configuration of another example of a conventional semiconductor integrated circuit device will be described. FIG. 6 is a plan view of another example of a planar layout of a conventional semiconductor integrated circuit device. As depicted in FIG. 6, a device has been proposed in which a portion of the ground wiring line (hereinafter, first ground wiring line) 113 is extended so as to turn back inwardly on the IC chip, and all of the EPROMs 101 are connected to this extended portion (hereinafter, second ground wiring line) 115. By making the distance from the ground terminal 111 on the ground wiring line of the EPROM 101 long and by making the parasitic resistance by the ground wiring line (the first and second ground wiring lines 113, 115) of the EPROM 101 high, tolerance with respect to noise (hereinafter, external noise) that enters the wiring line from an external source is increased. Excluding the positions of the connection points on the ground wiring line of the EPROMs and the second ground wiring line 115, the configuration of the conventional semiconductor integrated circuit device depicted in FIG. 6 is identical to that of the conventional semiconductor integrated circuit device depicted in FIG. 5.

As a semiconductor integrated circuit device for which tolerance to external noise has been increased, a device has been proposed in which a protective function against external noise of the EPROM is provided whereby unintended writing (errant writing) to the EPROM by external noise is prevented (for example, refer to Japanese Patent Application Laid-Open Publication Nos. 2009-231650, 2005-026307, 2012-209526, and 2012-160611).

Nonetheless, with the conventional semiconductor integrated circuit devices described above, the following problems arise when redundancy design against charge leakage and charge injection of the EPROMs is performed and components disposed at mutually close positions on the IC chip (e.g., adjacent EPROMs 101) are combined to suppress increases in the area of the IC chip 100.

Natural deterioration, oxide film defects, and external noise may cause charge leakage of the EPROMs 101, while external noise may cause charge injection of the EPROMs 101. Charge leakage consequent to natural deterioration occurs similarly at all of the EPROMs 101. Therefore, even if the redundancy design against charge leakage of EPROMs 101 is performed as depicted in FIG. 5, redundancy with respect to data retention characteristics of the EPROMs 101 is not substantially achieved. The redundancy design against charge leakage of the EPROMs 101 depicted in FIG. 5 is a configuration in which identical data is written to adjacent EPROMs 101 (101a, 101b) and the EPROMs 101 are connected to a single OR circuit 104.

Meanwhile, charge leakage of the EPROMs 101 consequent to oxide film defects occurs as a result of current leaked by fine crystal defects that have a certain probability of being inside the oxide film. Therefore, the probability that both of the adjacent EPROMs 101 have an oxide film defect and low data retention characteristics is not substantially different from the probability of the same between EPROMs 101 that are not adjacent to each other. Therefore, redundancy with respect to the data retention characteristics of the EPROMs 101 is obtained by performing the redundancy design against charge leakage of the EPROMs 101 as depicted in FIG. 5.

Nonetheless, the adjacent EPROMs 101 are adversely affected by external noise to the same extent and therefore, charge leakage and charge injection of the EPROMs 101 occurs at the same extent in each EPROM 101. Adverse effects of external noise include errant writing to the EPROM 101 consequent to disposal near components that generate noise such as near external components and the wiring thereof and the terminals 111, 112; and errant operation consequent to a ground potential increase or write_voltage caused by electromagnetic induction of a coil resulting from disposal near a component that includes a coil such as an igniter. Therefore, redundancy with respect to the data retention characteristics of the EPROMs 101 is not obtained even when the redundancy design against charge leakage of the EPROMs 101 is performed as depicted in FIG. 5.

Further, although measures such as providing a protective function (refer to Japanese Patent Application Laid-Open Publication Nos. 2009-231650, 2005-026307, 2012-209526, and 2012-160611) and increasing the parasitic resistance by the ground wiring lines 113, 115 of the EPROMs 101 (refer to FIG. 6) are effective for enhancing tolerance against certain external noise, these measures are not effective against all external noise. Therefore, a tradeoff exists where it may be better to not implement the measures above to improve tolerance with respect to other external noise and it is difficult to improve tolerance against all external noise to prevent charge leakage and charge injection of the EPROM 101.

SUMMARY OF THE INVENTION

To solve the problems above and achieve an object, a semiconductor integrated circuit device according to an embodiment of the invention has a plurality of read-dedicated memories that store data by an electrical rewriting operation. The semiconductor integrated circuit device includes a ground terminal that provides ground potential; a ground line disposed on a semiconductor chip and connected between the ground terminal and the plurality of memories; and a plurality of memory groups that respectively include at least two memories that store identical data and are among the plurality of memories. The ground line has a ground wiring portion and an extended ground wiring portion that is connected to the ground wiring portion, extends from a connection site with the ground wiring portion, and is disposed a first predetermined distance from the ground wiring portion. In a memory group among the plurality of memory groups, at least two of the memories are disposed adjacent to each other, and among two of the memories disposed adjacent to each other, one memory is connected to the ground wiring portion and the other memory is connected to the extended ground wiring portion.

In the semiconductor integrated circuit device, respective connection points between the ground line and the memories included in a first memory group among the plurality of memory groups sandwich at least one connection point between the ground line and the memories included in a second memory group among the plurality of memory groups.

The semiconductor integrated circuit device further includes a power-supply voltage terminal that supplies power-supply voltage; a first write_voltage terminal that supplies first write_voltage that is at least the power-supply voltage; and a write_voltage line that is disposed on the semiconductor chip and connected between the first write_voltage terminal and the plurality of memories. The write_voltage line has a write_voltage wiring portion and an extended write_voltage wiring portion that is connected to the write_voltage wiring portion, extends from a connection site with the write_voltage wiring portion, and is disposed a second predetermined distance from the write_voltage wiring portion. In the memory group, at least two of the memories are disposed adjacent to each other, and among two of the memories disposed adjacent to each other, one memory is connected to the write_voltage wiring portion, and the other memory is connected to the extended write_voltage wiring portion.

To solve the problems above and achieve an object, a semiconductor integrated circuit device according to an embodiment of the invention has a plurality of read-dedicated memories that store data by an electrical rewriting operation. The semiconductor integrated circuit device includes a first write_voltage terminal that supplies first write_voltage that is for writing the data to the plurality of memories and that is at least a power-supply voltage; a write_voltage line that is disposed on a semiconductor chip and connected between the first write_voltage terminal and the plurality of memories; and a plurality of memory groups that respectively include at least two memories that store identical data and are among the plurality of memories. The write_voltage line has a write_voltage wiring portion and an extended write_voltage wiring portion that is connected to the write_voltage wiring portion, extends from a connection site with the write_voltage wiring portion, and is disposed a first predetermined distance from the write_voltage wiring portion. In a memory group among the plurality of memory groups, at least two of the memories are disposed adjacent to each other, and among two of the memories disposed adjacent to each other, one memory is connected to the write_voltage wiring portion and the other memory is connected to the extended write_voltage wiring portion.

In the semiconductor integrated circuit device respective connection points between the write_voltage line and the memories included in a first memory group among the plurality of memory groups sandwich at least one connection point between the write_voltage line and the memories included in a second memory group among the plurality of memory groups.

In the semiconductor integrated circuit device, the plurality of memories are connected to a portion that is closer to the ground terminal than a connection site between the ground wiring portion and the extended ground wiring portion is and the plurality of memories are connected to a portion that is farther from the first write_voltage terminal than a connection site between the write_voltage wiring portion and the extended write_voltage wiring portion is.

In the semiconductor integrated circuit device, the plurality of memories are connected to a portion that is farther from the ground terminal than a connection site between the ground wiring portion and the extended ground wiring portion is and the plurality of memories are connected to a portion that is closer to the first write_voltage terminal than a connection site between the write_voltage wiring portion and the extended write_voltage wiring portion is.

In the semiconductor integrated circuit device, in the memory group, the memories are disposed adjacent to each other on the semiconductor chip.

The semiconductor integrated circuit device further includes a logical circuit that obtains one of a logical sum and a majority function of the data stored by all the memories included in the memory group.

The semiconductor integrated circuit device further includes a sensor device that generates an electrical signal corresponding to a detected physical quantity; an output terminal that outputs to an external device, the electrical signal generated by the sensor device; a data input terminal that inputs trimming data used to adjust output characteristics of the sensor device; an auxiliary memory circuit that temporarily stores therein the trimming data; a read-dedicated main memory circuit that stores therein by the electrical rewrite operation, the trimming data stored in the auxiliary memory circuit; a first write_voltage terminal that supplies first write_voltage that is at least power-supply voltage; a second write_voltage terminal that supplies to the main memory circuit, second write_voltage that is at least the power-supply voltage and differs from the first write_voltage; an operation selector circuit that controls operation of the auxiliary memory circuit and the main memory circuit, based on data stored in the auxiliary memory circuit; and an adjuster circuit that adjusts the output characteristics of the sensor device, based on one of the trimming data stored in the auxiliary memory circuit and the trimming data stored in the main memory circuit. The main memory circuit has at least one memory group among the plurality of memory groups.

The other objects, features, and advantages of the present invention are specifically set forth in or will become apparent from the following detailed description of the invention when read in conjunction with the accompanying drawings.

DETAILED DESCRIPTION OF THE INVENTION

Embodiments of a semiconductor integrated circuit device according to the present invention will be described in detail with reference to the accompanying drawings. In the description of the embodiments and drawings, identical components are given the same reference numerals and redundant description is omitted.

Figure 1:
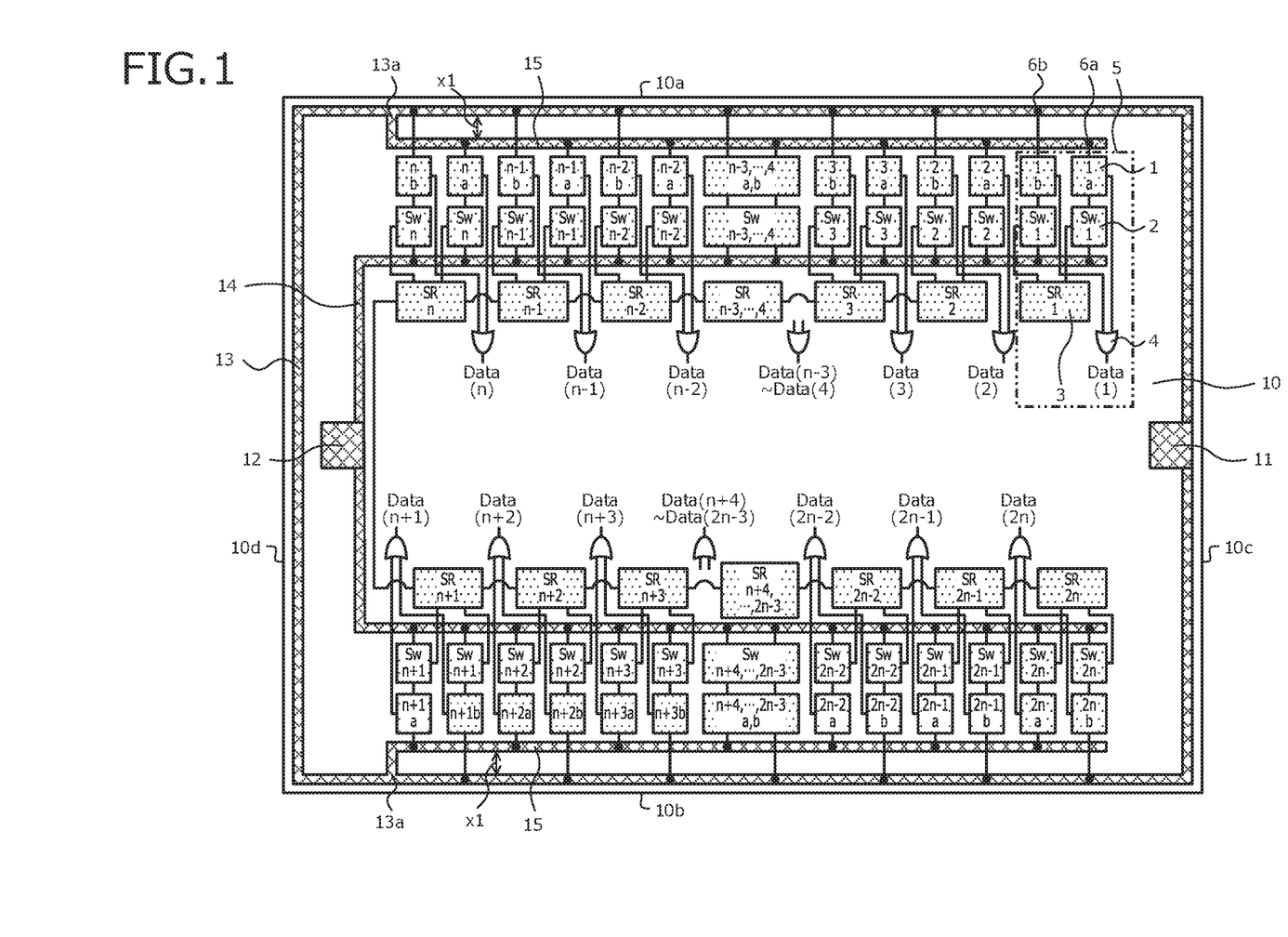
FIG. 1 is a plan view of a planar layout of a memory circuit of a semiconductor integrated circuit device according to a first embodiment.

Configuration of a memory circuit of the semiconductor integrated circuit device according to a first embodiment will be described. FIG. 1 is a plan view of a planar layout of the memory circuit of the semiconductor integrated circuit device according to the first embodiment. The memory circuit of the semiconductor integrated circuit device according to the first embodiment depicted in FIG. 1 is produced on an IC chip (semiconductor chip) 10 and includes multiple EPROMs 1, switches (Sw) 2, shift registers (SR) 3, and OR circuits 4. These components, for example, are configured by only passive elements and active elements manufactured on a single IC chip 10 by a complementary metal oxide semiconductor (CMOS) manufacturing process. The EPROMs 1 are MOSFETs that are equipped with a gate in a flooding state (flooding gate) and have a control gate disposed on the flooding gate via an oxide film. The switches 2, for example, are MOSFETs.

Two or more of the EPROMs 1 storing identical data form a 1-bit storage region 5 of the memory circuit. The storage region 5 is disposed corresponding to the storage capacity (bit count) of the memory circuit. Here, description will be given taking a case where the storage capacity of the memory circuit is assumed to be 2n (n: natural number) bits, and the 1-bit storage region 5 is configured by two of the EPROMs 1 (a and b in FIGS. 1; and 1a and 1b, hereinafter). The two or more EPROMs 1 storing identical data, the single OR circuit 4 connected to all of these EPROMs 1, the switches 2 equivalent in number to these EPROMs 1 and respectively connected to the EPROMs 1, and the single shift register 3 connected to all of these switches 2 may be disposed at positions mutually close (e.g., disposed to be adjacent) to each other on the IC chip 10 and thereby, enable increased wiring efficiency for wiring lines 13, 14, and 15, and suppression of increases in the size of the IC chip 10. An example of a planar layout of the EPROMs 1, the switches 2, the shift registers 3, the OR circuits 4, and the wiring lines 13, 14, and 15 disposed on the IC chip 10 will be described.

For example, at peripheral portions of the IC chip 10 that is a substantially rectangular shape, the EPROMs 1 are disposed in a row so as to be along peripheries 10a, 10b corresponding to a first pair of opposite sides of the IC chip 10. The same data is stored to the EPROMs 1a, 1b that are adjacent, and the 1-bit storage region 5 is configured with the EPROMS 1a, 1b. As depicted in FIG. 1, bit numbers assigned to the EPROMs 1a, 1b storing identical data are 1, 2, 3, 4, . . . , n−3, n−2, n−1, n, n+1, n+2, n+3, n+4, . . . , 2n−3, 2n−2, 2n−1, and 2n. Further, FIG. 1 depicts a state in which the EPROMs 1a, 1b to which bits 1 to n are assigned are disposed in a row along the periphery 10a of the IC chip 10; and the EPROMs 1a, 1b to which bits (n+1) to 2n are assigned are disposed in a row along the periphery 10b of the IC chip 10. The EPROMs 1a, 1b to which bits 4 to (n−3) are assigned and the EPROMs 1a, 1b to which bits (n+4) to (2n−3) are assigned are depicted in a simplified manner (similarly concerning the switches 2, the shift registers 3, and the OR circuits 4).

The EPROMs 1a, 1b that store identical data are respectively connected to one switch 2 each. Each switch 2, for example, is disposed at a position that is farther inward on the IC chip 101 than the EPROMs 1 and near the EPROM 1 to which the switch 2 is connected. More specifically, for example, each switch 2 may be disposed farther inward on the IC chip than the EPROMs 1, so as to oppose the EPROM 1 to which the switch 2 is connected. In other words, the switches 2, for example, may be disposed in a row, substantially parallel to the peripheries 10a, 10b of the IC chip and farther inward than the EPROMs 1. The source of each EPROM 1a, 1b is connected to the ground wiring lines 15, 13 described hereinafter. The drain of each EPROM 1a, 1b is connected to the source of the switch 2 specific to the EPROM 1a, 1b. The drain of each switch 2 is connected to the write_voltage wiring line 14 described hereinafter.

The writing of data to an EPROM 1 is controlled by the ON/OFF state of the switch 2 connected to the EPROM 1. In other words, the switches 2 connected to EPROMs 1 that are to perform writing are set to an ON state and the switches 2 connected to EPROMs 1 that are not to perform writing are set to an OFF state. Setting predetermined switches 2 to ON causes the EPROMs 1 connected to the switches 2 and the write_voltage terminal 12 to conduct. Write_voltage is applied to the write_voltage terminal 12 whereby the write_voltage is applied to the drains of the EPROMs 1 via the write_voltage wiring line 14, and high voltage of a threshold voltage or greater is applied to the control gates of the EPROMs 1 whereby, charge is injected into and accumulated in the flooding gates of the predetermined EPROMs 1, and the writing of data to the EPROMs 1 is completed.

The gates of the switches 2 connected to the EPROMs 1a, 1b that store identical data are connected to a single shift register 3. Each shift register 3, for example, is disposed at a position that is farther inward than the switches 2 and near the switches 2 to which the shift register 3 is connected. More specifically, for example, each shift register 3 may be disposed farther inward on the IC chip 10 than the switches 2 so as to oppose the switches 2 to which the shift register 3 is connected. In other words, the shift registers 3, for example, may be disposed in a row, substantially parallel to the peripheries 10a, 10b of the IC chip and farther inward than the switches 2. All of the shift registers 3 are electrically connected.

The shift registers 3 have a function of switching the switches 2 ON and OFF. More specifically, the two switches 2 connected to a shift register 3 are ON when the state of the shift register 3 is "1" and is OFF when the state of the shift register 3 is "0".

Each OR circuit 4, for example, is disposed farther inward on the IC chip 10 than the switches 2 connected to the same EPROM 1a, 1b, at a position that is near the shift register 3 that is connected to the switches 2. More specifically, for example, each OR circuit 4 may be disposed farther inward than the switches 2, in a row substantially parallel to the peripheries 10a, 10b of the IC chip. Each OR circuit 4 is connected to two or more EPROMs 1 (i.e., EPROMs 1a, 1b) that store identical data and form a 1-bit storage region 5 of the memory circuit. Each OR circuit 4 outputs as 1 bit of the memory circuit, the logical sum of the data stored by the EPROM 1 connected to the OR circuit 4. In other words, a redundancy design against charge leakage at the EPROMs 1a, 1b is achieved such that even when charge leakage occurs at one EPROM among the EPROMs 1a, 1b, output Data (i) (i=1, 2, . . . , 2n−1, 2n) from the OR circuit 4 is maintained. Output Data (i) of the OR circuits 4 is output to an external device from a non-depicted terminal, via the shift registers 3.

On the IC chip 10, a ground terminal (ground pad) 11, a write_voltage terminal (write_voltage pad) 12, the ground wiring line 13, and the write_voltage wiring line 14 are disposed. The ground terminal 11 provides ground potential of the semiconductor integrated circuit device. The write_voltage terminal 12 is higher than the power source electric potential of the semiconductor integrated circuit device and supplies drain voltage (write_voltage) to the EPROMs 1 via the switches 2. The ground terminal 11 and the write_voltage terminal 12, for example, are disposed respectively at peripheries 10c, 10d corresponding to a second pair of opposite sides of the IC chip 10 and at which the EPROMs 1, the switches 2, the shift registers 3, and the OR circuits 4 are not disposed. The ground wiring line 13 is disposed farther outward on the IC chip 10 than the EPROMs 1, in a substantially rectangular shape along the peripheries 10a to 10d of the IC chip 10, and is connected to the ground terminal 11 near the periphery 10c of the IC chip 10.

On the IC chip 10, an extended wiring portion (hereinafter, second ground wiring line) 15 is further disposed that is connected to the ground wiring line (hereinafter, first ground wiring line (ground wiring portion)) 13, extends from a connection site (hereinafter, ground wiring line connection site (connection point)) 13a with the first ground wiring line 13, and is disposed a predetermined distance x1 from the first ground wiring line 13. Hereinafter, a case where, for example, the second ground wiring line 15 is connected to the first ground wiring line 13 at an end of the second ground wiring line 15 will be described as an example. The second ground wiring line 15 extends from a portion of the first ground wiring line 13 inwardly such that, for example, the second ground wiring line 15 turns back to form an open, substantially rectangular shape (e.g., substantially a "U" shape or substantially a "⊐" shape, hereinafter, collectively, "open rectangular shape") with the first ground wiring line 13. The second ground wiring line 15 is disposed between the first ground wiring line 13 and the EPROMs 1, at the predetermined distance x1 from the first ground wiring line 13 and substantially parallel to the first ground wiring line 13. In other words, the first and second ground wiring lines 13, 15 are disposed farther outward on the IC chip 10 than the EPROMs 1 and substantially parallel to the peripheries 10a, 10b of the IC chip 10, in a doubled manner. As a result, the second ground wiring line 15, which is substantially parallel to the first ground wiring line 13, is disposed so as to be adjacent to the first ground wiring line 13 and is separated from the ground terminal 11 by a greater distance than the first ground wiring line 13. The length of the second ground wiring line 15 may be a length such that the second ground wiring line 15 opposes all of the EPROMs 1a, 1b disposed in a row along the periphery 10a of the IC chip 10, or substantially the same length as the portion of the first ground wiring line 13 parallel to the peripheries 10a, 10b of the IC chip 10.

The source of the first EPROM 1a among the EPROM 1a, 1b storing identical data is connected to the second ground wiring line 15; and the source of the second EPROM 1b thereof is connected to the first ground wiring line 13. In other words, among the EPROMs 1a, 1b storing identical data, a connection point 6a of the first EPROM 1a and the second ground wiring line 15 and a connection point 6b of the second EPROM 1b and the first ground wiring line 13 are not adjacent to each other on the ground wiring lines or linearly on the ground wiring lines. The connection points 6a, 6b not being adjacent to each other on the ground wiring lines means that at least one connection point of the ground wiring lines and EPROMs (e.g., 2a, 2b or na, nb) configuring another storage region 5 is included between the connection points 6a, 6b of the ground wiring lines and the EPROMs 1a, 1b (to store identical data) that configure one storage region 5. The connection points 6a, 6b not being adjacent to each other linearly on the ground wiring lines means that a connection site 13a of the first and second ground wiring lines 13, 15 disposed substantially parallel to each other is included between the connection points 6a, 6b of the ground wiring lines and the EPROMs 1a, 1b that configure one storage region 5.

Connection of the EPROMs 1a, 1b and the first and second ground wiring lines 13, 15 in this manner disposes the connection point 6a of the first EPROM 1a and the ground wiring line at a position that is away from the ground terminal 11 and reached from the ground terminal 11 by way of the ground wiring line connection site 13a. The connection point 6b of the second EPROM 1b and the ground wiring line is disposed between the ground terminal 11 and the ground wiring line connection site 13a. As a result, even when the distance on the IC chip 10, between the connection points 6a, 6b of the ground wiring lines and the EPROMs 1a, 1b storing identical data is a length close to the interval x1 between the first and second ground wiring lines 13, 15, the distance on the ground wiring lines between the connection points 6a, 6b can be increased. In other words, among the EPROMs 1a, 1b storing identical data, the parasitic resistance of the first EPROM 1a consequent to the ground wiring lines (first and second ground wiring lines 13, 15) becomes greater than the parasitic resistance of the second EPROM 1b consequent to the ground wiring line (first ground wiring line 13). As a result, the extent to which the voltage increases with respect to the ground terminal 11, i.e., the tolerance of the EPROMs 1a, 1b against external noise (noise entering wiring lines from an external source) can be made to differ.

The write_voltage wiring line 14 is disposed between the switches 2 and, the shift registers 3 and the OR circuits 4, for example, in an open rectangular shape along the peripheries 10a, 10b, 10d of the IC chip 10, and is connected to the write_voltage terminal 12. All of the switches 2 are connected to the write_voltage wiring line 14. The EPROMs 1a, 1b are electrically connected to the write_voltage wiring line 14 via dedicated switches 2. The supply of write_voltage (drain voltage) to the EPROMs 1 is controlled by the ON/OFF state of the switches 2. High voltage when data is written to the EPROMs 1 is applied to the control gates of the EPROMs 1. When high voltage is applied to the control gates and write_voltage is applied to the drains of the EPROMs 1 via the write_voltage wiring line 14, data is written to the EPROMs 1 consequent to charge being injected into and accumulated in the flooding gate.

As described, according to the first embodiment, on the ground wiring lines, the distance from the ground terminals to two or more EPROM arranged close to each other on the IC chip and storing identical data can be increased compared to conventional devices, by disposing a portion of the ground wiring lines in a doubled manner where the first and second ground wiring lines are disposed a predetermined distance from each other. As a result, for the two or more EPROMs that are disposed close to each other on IC chip and that store identical data, the tolerance against external noise can be made to respectively differ. Therefore, wiring efficiency is increased, enabling increases in the size of the IC chip to be suppressed, and redundancy with respect to the data retention characteristics of the EPROMs can be enhanced without increasing the number (EPROM count) of unit cells configuring the memory circuit. Consequently, since compared to conventional EPROMs, EPROMs that are disposed closer to components that generate noise as well as IC chips and memory circuits equipped with these EPROM can be disposed, the degree of freedom in design is improved.

Figure 2:
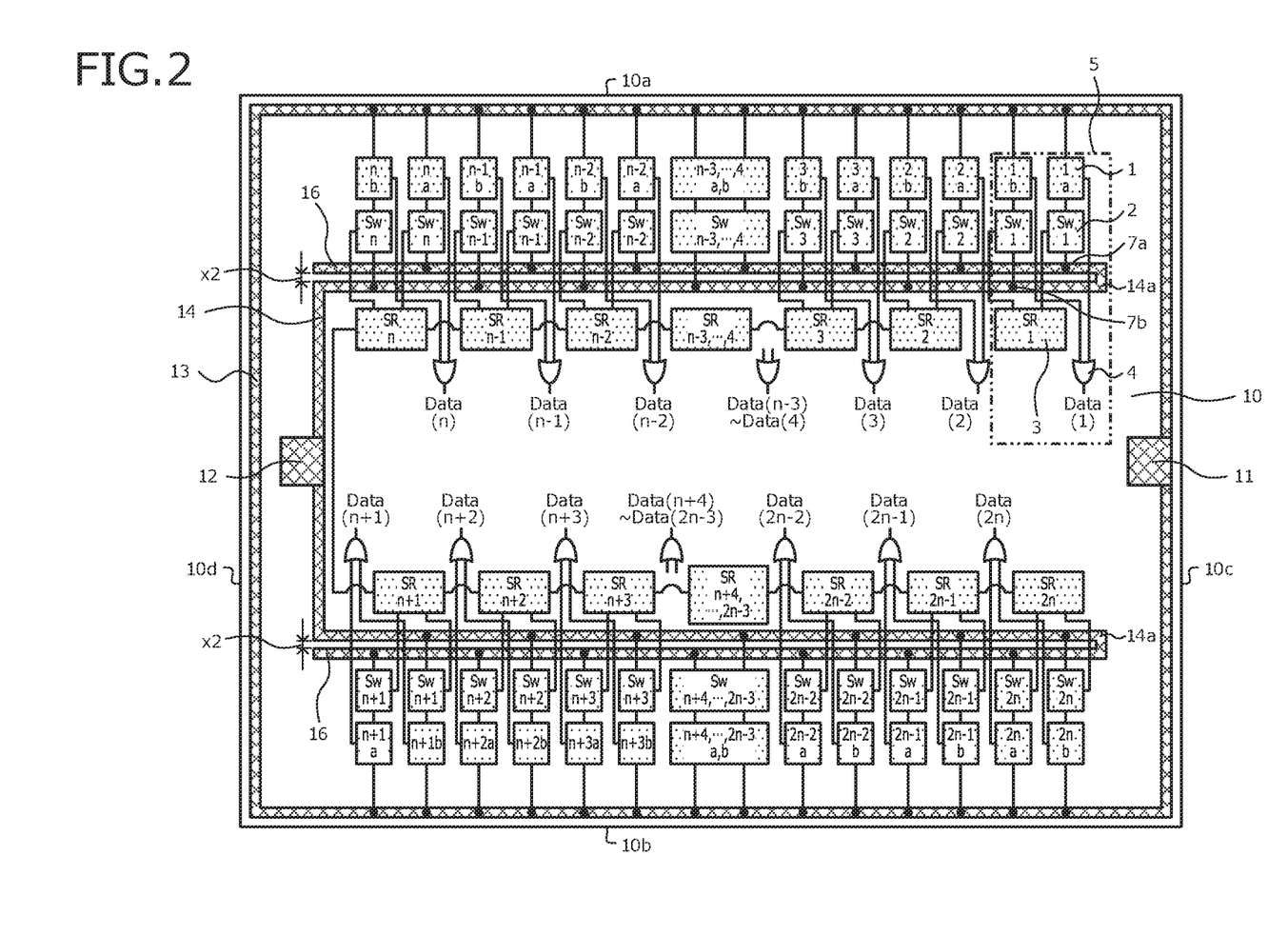
FIG. 2 is a plan view of a planar layout of the memory circuit of the semiconductor integrated circuit device according to a second embodiment.

A configuration of the memory circuit of the semiconductor integrated circuit device according to a second embodiment will be described. FIG. 2 is a plan view of a planar layout of the memory circuit of the semiconductor integrated circuit device according to the second embodiment. The semiconductor integrated circuit device according to the second embodiment differs from the semiconductor integrated circuit device according to the first embodiment in that the write_voltage wiring line is disposed in a doubled manner, not the ground wiring line. In other words, with respect to the EPROMs 1a, 1b, which are disposed close to each other on the IC chip 10, the distance on write_voltage wiring line to each the EPROM 1a, 1b from the write_voltage terminal 12 can be varied respectively.

The write_voltage wiring line (hereinafter, first write_voltage wiring line (write_voltage wiring portion)) 14 is disposed between the switches 2 and, the shift registers 3 and the OR circuits 4, for example, in an open rectangular shape along the peripheries 10a, 10b, 10d of the IC chip 10, and is connected to the write_voltage terminal 12. On the IC chip 10, an extended wiring portion (hereinafter, second write_voltage wiring line) 16 is further disposed that is connected to the first write_voltage wiring line 14, extends from a connection site (connection point) 14a with the first write_voltage wiring line 14, and is disposed a predetermined distance x2 from the first write_voltage wiring line 14. Hereinafter, a case where, for example, the second write_voltage wiring line 16 is connected to the first write_voltage wiring line 14 at an end of the second write_voltage wiring line 16 will be described as example. The second write_voltage wiring line 16 extends from a portion of the first write_voltage wiring line 14 outwardly on the IC chip 10 such that, for example, the second write_voltage wiring line 16 turns back to form an open rectangular shape with the first write_voltage wiring line 14. The second write_voltage wiring line 16 is disposed between the first write_voltage wiring line 14 and the switches 2, at the predetermined distance x2 from the first write_voltage wiring line 14 and substantially parallel to the first write_voltage wiring line 14. In other words, the first and second write_voltage wiring lines 14, 16 are disposed farther inward on the IC chip 10 than the switches 2 and substantially parallel to the peripheries 10a, 10b of the IC chip 10, in a doubled manner. As a result, the second write_voltage wiring line 16, which is substantially parallel to the first write_voltage wiring line 14 so as to be adjacent to the first write_voltage wiring line 14 and is separated from the write_voltage terminal 12 by a greater distance than the first write_voltage wiring line 14 is, is disposed. The second write_voltage wiring line 16 may extend from a portion of the first write_voltage wiring line 14, for example, inwardly on the IC chip 10 such that the second write_voltage wiring line 16 turns back to form an open rectangular shape with the first write_voltage wiring line 14. In other words, the second write_voltage wiring line 16 may be disposed between the first write_voltage wiring line 14 and the shift registers 3, at the predetermined distance x2 from the first write_voltage wiring line 14, and substantially parallel to the first write_voltage wiring line 14. The second write_voltage wiring line 16 and the portion of the first write_voltage wiring line 14 overlapping the second write_voltage wiring line 16 may be substantially the same length. The length of the second write_voltage wiring line 16 may be a length such that the second write_voltage wiring line 16 opposes all of the switches 2 disposed in a row along the periphery 10a of the IC chip 10.

Among the two switches connected to the EPROMs 1a, 1b storing identical data, the drain of a first switch 2 is connected to the second write_voltage wiring line 16 and the drain of a second switch 2 is connected to the first write_voltage wiring line 14. In other words, among the EPROMs 1a, 1b storing identical data, a connection point 7a of the second write_voltage wiring line 16 and the switch 2 connected to the first EPROM 1a and a connection point 7b of the first write_voltage wiring line 14 and the switch 2 connected to the second EPROM 1b are not adjacent to each other on write_voltage wiring line and are not linearly adjacent to each other on write_voltage wiring line. The connection points 7a, 7b not being adjacent to each other means that at least one connection point of the write_voltage wiring lines and the EPROMs 1 configuring another storage region 5 is included between the connection points 7a, 7b of the write_voltage wiring lines and the EPROMs 1a, 1b (to store identical data) that configure one storage region 5. The connection points 7a, 7b not being adjacent to each other linearly means that a connection site (hereinafter, write_voltage wiring line connection site) 14a of the first and second write_voltage wiring lines 14, 16 disposed substantially parallel to each other is included between the connection points 7a, 7b of the write_voltage wiring line and the EPROMs 1a, 1b that configure one storage region 5.

Connection of the EPROMs 1a, 1b and the first and second write_voltage wiring lines 14, 16 in this manner disposes the connection point 7a of the first EPROM 1a and the write_voltage wiring line at a position that is away from the write_voltage terminal 12 and reached from the write_voltage terminal 12 by way of the write_voltage wiring line connection site 14a. The connection point 7b of the second EPROM 1b and the write_voltage wiring line is disposed between the write_voltage terminal 12 and the write_voltage wiring line connection site 14a. As a result, even when the distance on the IC chip 10, between the connection points 7a, 7b of the EPROMs 1a, 1b storing identical data and the write_voltage wiring lines is a length close to the interval x2 between the first and second write_voltage wiring lines 14, 16, the distance on the write_voltage wiring lines between the connection points 7a, 7b can be increased. Therefore, among the EPROMs 1a, 1b storing identical data, the parasitic resistance of the first EPROM 1a consequent to the write_voltage wiring lines (first and second write_voltage wiring lines 14, 16) becomes greater than the parasitic resistance of the second EPROM 1b consequent to the write_voltage wiring line (first write_voltage wiring line 14). As a result, similar to the first embodiment, the tolerance of the EPROMs 1a, 1b against external noise can be made to differ.

The second write_voltage wiring line 16 may be disposed between the first write_voltage wiring line 14 and the shift registers 3, substantially parallel to the first write_voltage wiring line 14. The ground wiring line 13 is disposed similarly to the first ground wiring line of the first embodiment. The sources of all the EPROMs 1a, 1b are connected to the ground wiring line 13. Configuration of the semiconductor integrated circuit device according to the second embodiment is identical to that of the first embodiment with the exception of the second write_voltage wiring line 16, the positions of the connection points of the EPROMs 1a, 1b on the ground wiring line, and the positions of the connection points of the switches 2 on the write_voltage wiring line.

As described, according to the second embodiment, effects identical to those of the first embodiment can be obtained.

Figure 3:
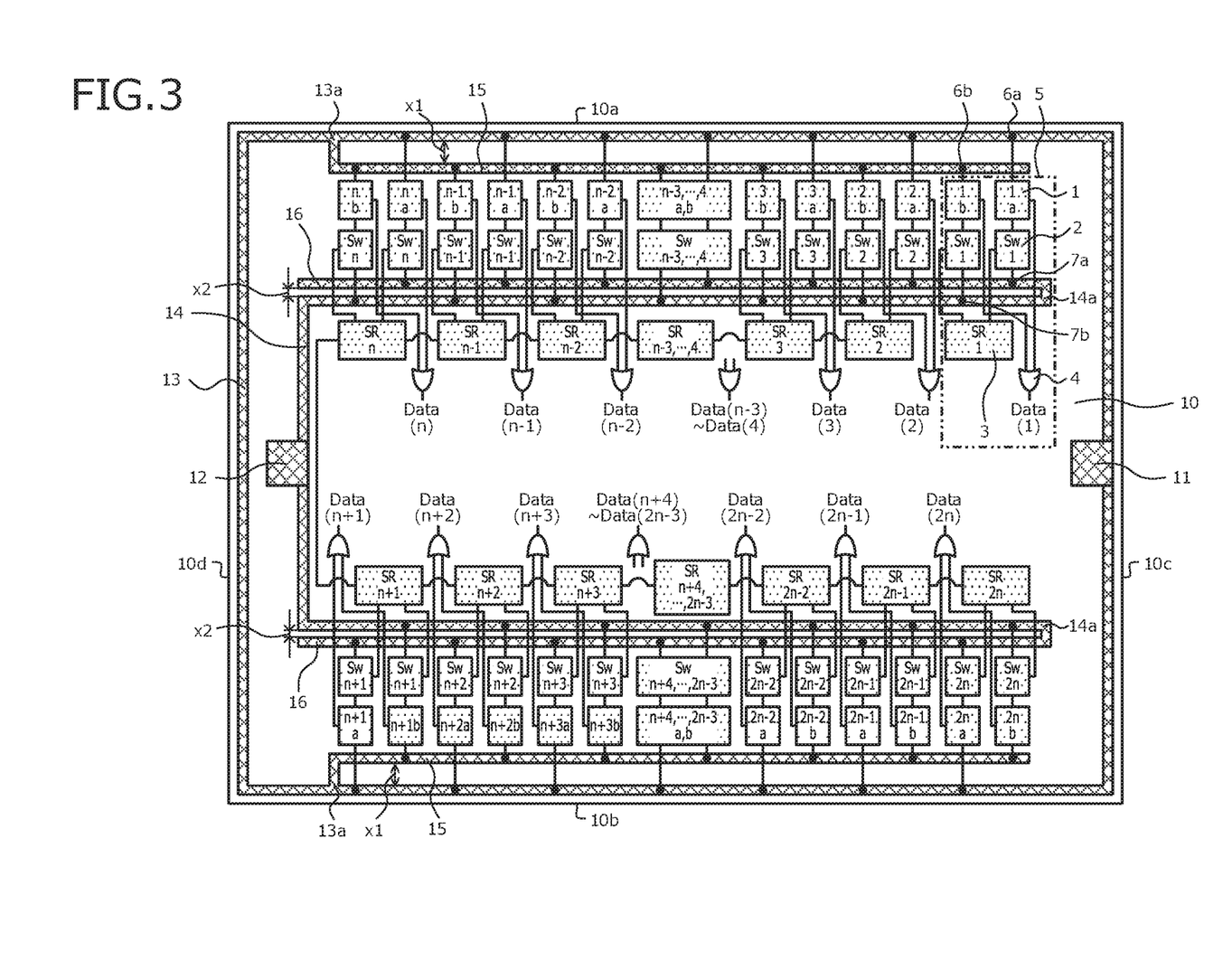
FIG. 3 is a plan view of a planar layout of the memory circuit of the semiconductor integrated circuit device according to a third embodiment.

Configuration of the memory circuit of the semiconductor integrated circuit device according to the third embodiment will be described. FIG. 3 is a plan view of a planar layout of the memory circuit of the semiconductor integrated circuit device according to the third embodiment. The semiconductor integrated circuit device according to the third embodiment is a semiconductor integrated circuit device obtained by applying the second embodiment to the first embodiment. More specifically, for example, similar to the first embodiment, the first and second ground wiring lines 13, 15 are disposed on the IC chip 10 and the EPROMs 1a, 1b storing identical data are respectively connected to the first and second ground wiring lines 13, 15. Further, similar to the second embodiment, the first and second write_voltage wiring lines 14, 16 are disposed on the IC chip 10 and the switches 2 respectively supplying drain voltage to the EPROMs 1a, 1b storing identical data are respectively connected to the first and second write_voltage wiring lines 16, 14.

Among the EPROMs 1a, 1b storing identical data, when the distance on the ground wiring line from the ground terminal 11 to the first EPROM 1a is relatively short, the distance on the write_voltage wiring line from the write_voltage terminal 12 to the first EPROM 1a may be relatively long. More specifically, the first EPROM 1a is connected to the ground wiring line at a portion that is closer to the ground terminal 11 than the ground wiring line connection site 13a is and the first EPROM 1a is connected to the write_voltage wiring line at a portion that is farther away from the write_voltage terminal 12 than the write_voltage wiring line connection site 14a is.

Similarly, among the EPROMs 1a, 1b storing identical data, the distance on the ground wiring line from the ground terminal 11 to the second EPROM 1b is made relatively longer and the distance on the write_voltage wiring line from the write_voltage terminal 12 to the second EPROM 1b is made relatively shorter. More specifically, the second EPROM 1b is connected to the ground wiring line at a portion that is farther away from the ground terminal 11 than the ground wiring line connection site 13a is and the second EPROM 1b is connected to the write_voltage wiring line at a portion that is closer to the write_voltage terminal 12 than the write_voltage wiring line connection site 14a is.

In this manner, at one EPROM 1, the tolerance against noise in the ground wiring line and the tolerance against noise in the write_voltage wiring line can be made to differ, enabling the tolerance against external noise to be further improved.

As described, according to the third embodiment, the distance from the ground terminal on the ground voltage line to EPROMs that are disposed close to each other on an IC chip and the distance from the write_voltage terminal on the write_voltage wiring line to the EPROMs can be varied. Thus, effects identical to those of the first and second embodiments can be obtained.

Figure 4:
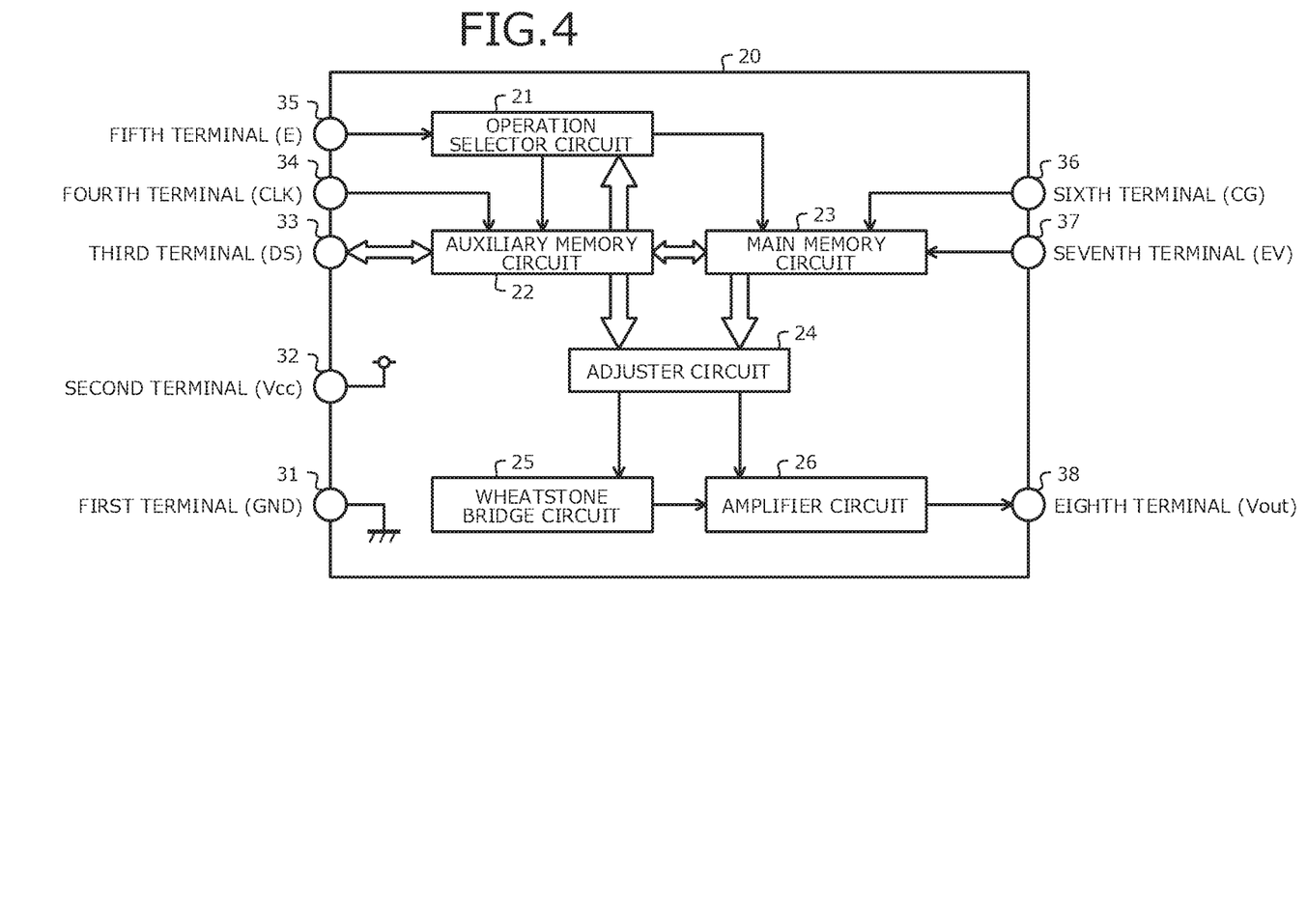
FIG. 4 is a block diagram of an example of overall configuration of the semiconductor integrated circuit device according to the present invention.

A fourth embodiment will be described. Here, an example of a semiconductor physical quantity sensor device will be described as an example of overall configuration of the semiconductor integrated circuit device according to the present invention. FIG. 4 is a block diagram of an example of overall configuration of the semiconductor integrated circuit device according to the present invention. This semiconductor physical quantity sensor device 20, for example, includes an operation selector circuit 21, an auxiliary memory circuit 22, a main memory circuit 23, an adjuster circuit 24, a Wheatstone bridge circuit 25 configured by a sensor device, an amplifier circuit 26, and eight (8) first to eighth terminals 31 to 38. The operation selector circuit 21, the auxiliary memory circuit 22, the main memory circuit 23, the adjuster circuit 24, the Wheatstone bridge circuit 25 configured by a sensor device, and the amplifier circuit 26, for example, are configured by only passive elements and active elements manufactured on a single IC chip by, for example, a CMOS manufacturing process.

The first terminal (ground terminal (GND)) 31 is a terminal that provides ground potential of the semiconductor physical quantity sensor device 20. The first terminal 31 corresponds to the ground terminal of the semiconductor integrated circuit device according to the first to third embodiments. The second terminal (power supply terminal (Vcc)) 32 is a terminal that supplies operating voltage (power-supply voltage) of the semiconductor physical quantity sensor device 20. The third terminal (data input terminal (DS)) 33 is a terminal that performs input and output of serial digital data (serial data). Serial digital data input to the third terminal 33, for example, is trimming data for adjusting output characteristics of the sensor device. The fourth terminal (CLK) 34 is a terminal that inputs an external clock.

The fifth terminal (E) 35 is a terminal that inputs a control signal of an internal digital circuit disposed on the IC chip. The sixth terminal (first write_voltage terminal (CG)) 36 is a terminal that supplies to the main memory circuit 23, voltage that is the operating voltage applied to the second terminal 32 or higher. The sixth terminal 36 corresponds to the write_voltage terminal of the first to third embodiments.

The seventh terminal (second write_voltage terminal (EV)) 37 is a terminal that supplies to the main memory circuit 23, voltage that is the operating voltage applied to the second terminal 32 or higher and differs from the voltage applied by the sixth terminal 36. The eighth terminal (output terminal (Vout)) 38 is a terminal that outputs to an external device, a signal generated by the semiconductor physical quantity sensor device 20.

The auxiliary memory circuit 22, at an operation timing based on the external clock, converts serial digital data supplied by an external device into parallel digital data (parallel data) for use by the semiconductor integrated circuit device. Further, the auxiliary memory circuit 22 converts parallel digital data used by the semiconductor integrated circuit device into serial digital data for output to an external device. The auxiliary memory circuit 22 further supplies control data to the operation selector circuit 21. The main memory circuit 23, according to the voltage applied by the sixth terminal 36 and the seventh terminal 37, stores trimming data created from parallel digital data supplied by the auxiliary memory circuit 22. The main memory circuit 23 corresponds to the memory circuit of the semiconductor integrated circuit device according to the first to third embodiments.

The operation selector circuit 21 supplies signals that control the input and output of data with respect to the auxiliary memory circuit 22 and the main memory circuit 23, based on the control data supplied by the auxiliary memory circuit 22 and the control signal input by the fifth terminal 35. In other words, operation of the auxiliary memory circuit 22 and the main memory circuit 23 is controlled by a control signal from the operation selector circuit 21. The Wheatstone bridge circuit 25 generates an output signal corresponding to a physical quantity of a medium measured. The amplifier circuit 26 amplifies the output signal from the Wheatstone bridge circuit 25 and outputs the signal to an external device via the eighth terminal 38. The adjuster circuit 24, based on the trimming data supplied by the auxiliary memory circuit 22 or the main memory circuit 23, adjusts the sensitivity for the Wheatstone bridge circuit 25 with consideration of temperature characteristics and adjusts the offset for the amplifier circuit 26 with consideration of temperature characteristics.

As described, according to the fourth embodiment, effects identical to those of the first embodiment can be obtained.

The present invention can be modified variously within a range not departing from the spirit of the present invention. For example, arrangement of the EPROMs, switches, shift registers and OR circuits, the number of EPROMs to store identical data, the positions of the connection points of EPROMs on the ground wiring line, the positions of the connection points of the switches on the write_voltage line, and the like may configured variously according required specifications. Further, arrangement of the extended wiring portions (second ground wiring line and second write_voltage line) of the ground wiring line and the write_voltage wiring line may be modified variously. For example, the connection site of the first ground wiring line (first write_power source wiring line) and the second ground wiring line (second write_power source wiring line) is not limited to being a connection of an end of the second ground wiring line (second write_power source wiring line) and the first ground wiring line (first write_power source wiring line), and may be a connection of site (connection point) other than an end of the second ground wiring line (second write_power source wiring line) and the first ground wiring line (first write_power source wiring line). In this case, for example, the second ground wiring line (second write_voltage wiring line) may extend from a connection site of the first ground wiring line (the first write_voltage wiring line) and a portion where the first and second ground wiring lines (first and second write_voltage wiring lines) are substantially parallel, such that the second ground wiring line (second write_voltage wiring line) extends in an opposite direction and parallel to the first ground wiring line (the first write_voltage wiring line) so as to turn back to form a substantially "H" shape where the second ground wiring line (second write_voltage wiring line) extends to two directions. Further, the ground wiring line and/or power source wiring lines may be disposed in a tripled manner, or extended at a substantially right angle along a periphery corresponding to two sides sharing a vertex of the IC chip. Further, majority function circuits may be used in place of the OR circuits to achieve redundancy design against charge leakage and charge injection of the EPROMs.

According to the present invention, the distance on the ground wire from the ground terminal to two or more memories (EPROM) storing identical data and disposed close to each other on the IC chip can be increased compared to a conventional device. As a result, wiring efficiency increases and increases in the size of the IC chip can be suppressed while redundancy with respect to data retention characteristics of the memory can be improved without increasing the number (memory count) of unit cells (device function units) configuring the memory circuit.

According to the semiconductor integrated circuit device of the present invention, effects are achieved in that increases in the area of the IC chip can be suppressed and data retention characteristics of the EPROMs can be improved.

As described, the semiconductor integrated circuit device of the present invention is useful in various semiconductor integrated circuit device equipped with a memory circuit configured by EPROM and is particularly, suitable in semiconductor physical quantity sensor devices that are equipped with a physical quantity sensor and used in various types of devices such as those for automobiles, medical purposes, manufacturing purposes, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit device having a plurality of read-dedicated memories that store data by an electrical rewriting operation, the semiconductor integrated circuit device comprising:
   a ground terminal that provides ground potential;
   a ground line disposed on a semiconductor chip and connected between the ground terminal and the plurality of read-dedicated memories; and
   a plurality of memory groups that respectively include at least two memories that store identical data and are among the plurality of read-dedicated memories, wherein
   the ground line has a ground wiring portion and an extended ground wiring portion that is connected to the ground wiring portion, extends from a connection site with the ground wiring portion, and is disposed a first predetermined distance from the ground wiring portion, and
   in a memory group among the plurality of memory groups, the at least two memories are disposed adjacent to each other, and among the at least two memories disposed adjacent to each other, one memory is connected to the ground wiring portion and another memory is connected to the extended ground wiring portion.

2. The semiconductor integrated circuit device according to claim 1, wherein
   respective connection points between the ground line and memories included in a first memory group among the plurality of memory groups precede and follow, respectively, along the ground line, at least one connection point between the ground line and memories included in a second memory group among the plurality of memory groups.

3. The semiconductor integrated circuit device according to claim 1 and further comprising:
   a power-supply voltage terminal that supplies power-supply voltage;
   a first write_voltage terminal that supplies a first write_voltage, wherein the first write_voltage is at least the power-supply voltage; and
   a write_voltage line that is disposed on the semiconductor chip and connected between the first write_voltage terminal and the plurality of read-dedicated memories, wherein
   the write_voltage line has a write_voltage wiring portion and an extended write_voltage wiring portion that is connected to the write_voltage wiring portion, extends from a connection site with the write_voltage wiring portion, and is disposed a second predetermined distance from the write_voltage wiring portion, and
   in another memory group of the plurality of memory groups, at least another two memories are disposed adjacent to each other, and among the at least another two memories disposed adjacent to each other, one memory is connected to the write_voltage wiring portion, and another memory is connected to the extended write_voltage wiring portion.

4. A semiconductor integrated circuit device having a plurality of read-dedicated memories that store data by an electrical rewriting operation, the semiconductor integrated circuit device comprising:
   a first write_voltage terminal that supplies a first write_voltage that is for writing the data to the plurality of read-dedicated memories and that is at least a power-supply voltage;
   a write_voltage line that is disposed on a semiconductor chip and connected between the first write_voltage terminal and the plurality of read-dedicated memories; and
   a plurality of memory groups that respectively include at least two memories that store identical data and are among the plurality of read-dedicated memories, wherein
   the write_voltage line has a write_voltage wiring portion and an extended write_voltage wiring portion that is connected to the write_voltage wiring portion, extends from a connection site with the write_voltage wiring portion, and is disposed a first predetermined distance from the write_voltage wiring portion, and
   in a memory group among the plurality of memory groups, the at least two memories are disposed adjacent to each other, and among the at least two memories disposed adjacent to each other, one memory is connected to the write_voltage wiring portion and another memory is connected to the extended write_voltage wiring portion.

5. The semiconductor integrated circuit device according to claim 4, wherein
respective connection points between the write_voltage line and memories included in a first memory group among the plurality of memory groups precede and follow, respectively, along the ground line, at least one connection point between the write_voltage line and memories included in a second memory group among the plurality of memory groups.

6. The semiconductor integrated circuit device according to claim 3, wherein
the plurality of read-dedicated memories are connected to a portion that is closer along the ground line to the ground terminal than a connection site between the ground wiring portion and the extended ground wiring portion, and the plurality of read-dedicated memories are connected to a portion that is farther along the write_voltage line from the first write_voltage terminal than a connection site between the write_voltage wiring portion and the extended write_voltage wiring portion.

7. The semiconductor integrated circuit device according to claim 3, wherein
the plurality of read-dedicated memories are connected to a portion that is farther along the ground line from the ground terminal than a connection site between the ground wiring portion and the extended ground wiring portion, and the plurality of read-dedicated memories are connected to a portion that is closer along the write_voltage line to the first write_voltage terminal than a connection site between the write_voltage wiring portion and the extended write_voltage wiring portion.

8. The semiconductor integrated circuit device according to claim 1, wherein
in the memory group, the at least two memories are disposed adjacent to each other on the semiconductor chip.

9. The semiconductor integrated circuit device according to claim 1, further comprising
a logical circuit that obtains at least one of a logical sum or a majority function of data stored by the at least two memories included in the memory group.

10. The semiconductor integrated circuit device according to claim 1, further comprising:
a sensor device that generates an electrical signal corresponding to a detected physical quantity;
an output terminal that outputs to an external device, the electrical signal generated by the sensor device;
a data input terminal that inputs trimming data used to adjust output characteristics of the sensor device;
an auxiliary memory circuit that temporarily stores the trimming data;
a read-dedicated main memory circuit that stores, by the electrical rewriting operation, the trimming data stored in the auxiliary memory circuit;
a first write_voltage terminal that supplies a first write_voltage that is at least a power-supply voltage;
a second write_voltage terminal that supplies to the read-dedicated main memory circuit, second write_voltage that is at least the power-supply voltage and differs from the first write_voltage;
an operation selector circuit that controls operation of the auxiliary memory circuit and the read-dedicated main memory circuit, based on data stored in the auxiliary memory circuit; and
an adjuster circuit that adjusts the output characteristics of the sensor device, based on at least one of the trimming data stored in the auxiliary memory circuit or the trimming data stored in the read-dedicated main memory circuit, wherein
the read-dedicated main memory circuit has at least one memory group among the plurality of memory groups.

11. The semiconductor integrated circuit device according to claim 4, wherein
in the memory group, the at least two memories are disposed adjacent to each other on the semiconductor chip.

12. The semiconductor integrated circuit device according to claim 4, further comprising
a logical circuit that obtains at least one of a logical sum or a majority function of the data stored by the at least two memories included in the memory group.

13. The semiconductor integrated circuit device according to claim 4, further comprising:
a sensor device that generates an electrical signal corresponding to a detected physical quantity;
an output terminal that outputs to an external device, the electrical signal generated by the sensor device;
a data input terminal that inputs trimming data used to adjust output characteristics of the sensor device;
an auxiliary memory circuit that temporarily stores the trimming data;
a read-dedicated main memory circuit that stores, by the electrical rewriting operation, the trimming data stored in the auxiliary memory circuit;
a first write_voltage terminal that supplies a first write_voltage that is at least a power-supply voltage;
a second write_voltage terminal that supplies to the read-dedicated main memory circuit, second write_voltage that is at least the power-supply voltage and differs from the first write_voltage;
an operation selector circuit that controls operation of the auxiliary memory circuit and the read-dedicated main memory circuit, based on data stored in the auxiliary memory circuit; and
an adjuster circuit that adjusts the output characteristics of the sensor device, based on at least one of the trimming data stored in the auxiliary memory circuit or the trimming data stored in the read-dedicated main memory circuit, wherein
the read-dedicated main memory circuit has at least one memory group among the plurality of memory groups.

* * * * *